(12) United States Patent
Dubin

(10) Patent No.: US 7,250,366 B2
(45) Date of Patent: Jul. 31, 2007

(54) CARBON NANOTUBES WITH CONTROLLED DIAMETER, LENGTH, AND METALLIC CONTACTS

(75) Inventor: Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/082,000

(22) Filed: Mar. 15, 2005

(65) Prior Publication Data

US 2006/0208362 A1   Sep. 21, 2006

(51) Int. Cl.
*H01L 21/44* (2006.01)
(52) U.S. Cl. ........................ 438/674; 977/742
(58) Field of Classification Search ............... 257/20, 257/24, 40, 758, E51.04; 438/622, 623, 438/626, 674, 691; 977/742
See application file for complete search history.

(56) References Cited

U.S. PATENT DOCUMENTS 6,440,763 B1 * 8/2002 Hsu ........................... 438/20
6,921,684 B2   7/2005 Dubin

OTHER PUBLICATIONS

U.S. Appl. No. 10/671,322, filed Sep. 24, 2003; Inventor: Valery Dubin.
U.S. Appl. No. 10/749,958, filed Dec. 30, 2003; Inventor: Valery Dubin.

* cited by examiner

*Primary Examiner*—David Vu
(74) *Attorney, Agent, or Firm*—David L. Guglielmi (57) ABSTRACT

Some embodiments of the present invention include fabricating carbon nanotube bundles with controlled length, diameter, and metallic contacts.

23 Claims, 6 Drawing Sheets

CARBON NANOTUBES WITH CONTROLLED DIAMETER, LENGTH, AND METALLIC CONTACTS

TECHNICAL FIELD

Embodiments of the invention relate to nanotechnology. In particular, embodiments of the invention relate to methods and apparatus for carbon nanotube fabrication.

BACKGROUND

In carbon nanotube fabrication, carbon nanotube bundles may be formed on support catalysts. The carbon nanotube bundles formed on the support catalysts may have a wide range of lengths and diameters. It may be desirable to control the lengths and diameters of the carbon nanotubes. In order to utilize the carbon nanotubes as conductors, it may be useful to metallize the ends of the carbon nanotubes.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, an apparatus and method relating to carbon nanotube bundles are described. In the following description, various embodiments will be described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn. However, the order of description should not be construed as to imply that these operations are necessarily order dependent. In particular, these operations need not be performed in the order of presentation.

Carbon nanotube bundle fabrication quality may be enhanced by controlling the bundle's length, diameter and metallic contacts. Further, carbon nanotube bundles with metallic contacts may be utilized as electrical interconnects in various devices such as microprocessors. Those electrical interconnects may provide advantages over conventional metallic interconnects. Specifically, metallized carbon nanotube bundles may provide lower electrical resistivity and higher electro-migration resistance. In particular, metallized carbon nanotube bundles may provide enhanced performance at small dimensions, such as approximately 20 nm across.

FIGS. 1A-1G illustrate cross-sectional type views of a method for forming carbon nanotube bundles with controlled length, diameter, and metallic ends.

Figure 1A:
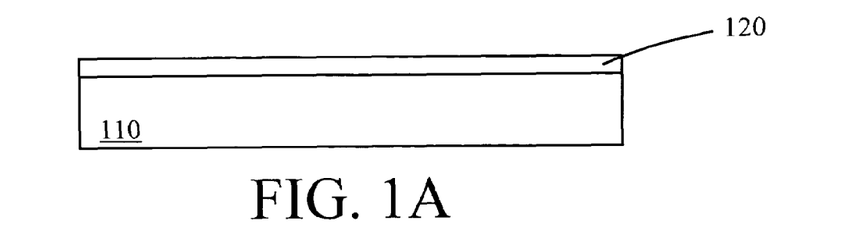
FIGS. 1A-1G illustrate a cross sectional type views of a method in accordance with one embodiment of the present invention.

FIG. 1A illustrates a conductive layer 120 on a substrate 110. Substrate 110 may be a wafer and may include monocrystalline Silicon, Aluminum, or other suitable materials. Conductive layer 120 may be formed on substrate 110 by any suitable technique including deposition, sputter, or plating. Conductive layer 120 may include any conductive material. In some embodiments, conductive layer 120 may include a metal. In some embodiments, conductive layer 120 may include Aluminum, Vanadium, Copper, Palladium, Gold, or Silver.

Figure 1B:
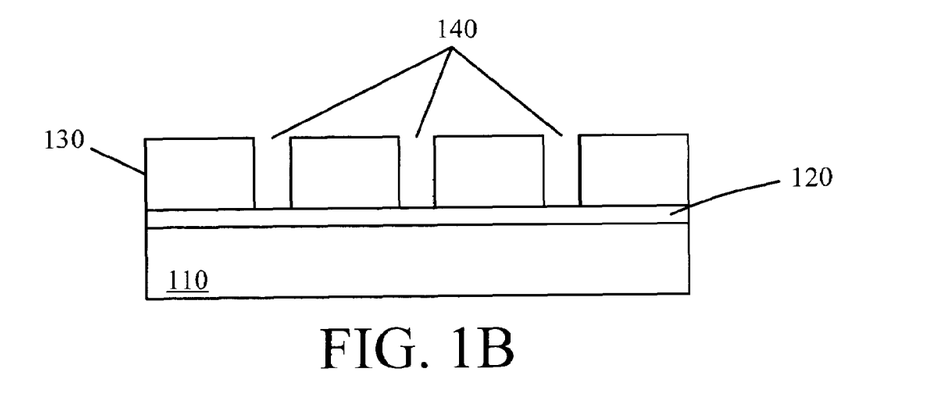

As shown in FIG. 1B a template film 130 including openings 140 may be formed on conductive layer 120. In some embodiments, template film 130 may include a dielectric material or a polymer material such as a Carbon doped oxide. In other embodiments, template film 130 may include Silicon Dioxide. In yet other embodiments, template film 130 may include a porous Aluminum Oxide. Template film 130 may be formed by providing a uniform layer over conductive layer 120 by known techniques such as spin-on, deposition, or others followed by formation of openings 140. In one embodiment, openings 140 may be formed by standard lithography and etch techniques utilized for via formation. In another embodiment, template film 130 may be a porous Aluminum Oxide formed by known techniques. Therefore, openings 140 may also be referred to as vias or pores.

Openings 140 may be formed such that their shape and dimensions may be controlled. In some embodiments, openings 140 may be approximately equal to or less than a desired size of the nanotube bundles, as is described below. In an embodiment, openings 140 may be approximately circular. In some embodiments, openings 140 may have a diameter in the range of about 2 to 200 nm. In other embodiments, openings may have a diameter in the range of about 2 to 100 nm. In other embodiments, openings may have a diameter in the range of about 10 to 40 nm. Other shapes and sizes may be available.

Additionally, template film 130 may be formed such that its thickness may be controlled. In some embodiments, template film 130 may have a thickness approximately equal to or less than a desired length of the nanotube bundles, as is described below. In some embodiments, template film 130 may have a thickness in the range of about 0.05 to 20 microns. In other embodiments, template film 130 may have a thickness in the range of about 0.1 to 10 microns. In other embodiments, template film 130 may have a thickness in the range of about 1 to 2 microns. Other thicknesses may be available.

Further, FIG. 1B illustrates only a portion of substrate 110, conductive layer 120, and template film 130 along with three openings of the same size for the sake of clarity. In other embodiments, there will be numerous other openings. In yet other embodiments, openings 140 may be designed to be of different size or shape to control the size or shape of the fabricated carbon nanotube bundles, as is described below.

Figure 1C:
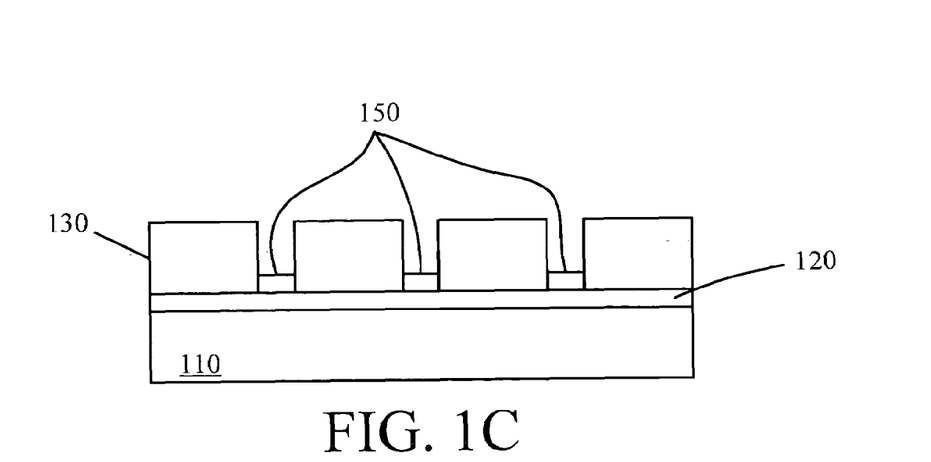

As shown in FIG. 1C, catalysts 150 may be formed at the bottom of openings 140 by any available selective deposition technique. In an embodiment, catalysts 150 may be formed by electrochemical deposition. In other embodiments, catalysts 150 may be formed by atomic layer deposition or chemical vapor deposition. Catalysts 150 may be any material or alloy that will facilitate the fabrication of carbon nanotubes. In various embodiments, catalysts 150 may include Iron, Cobalt, Nickel, Platinum, Molybdenum, or their alloys.

Figure 1D:
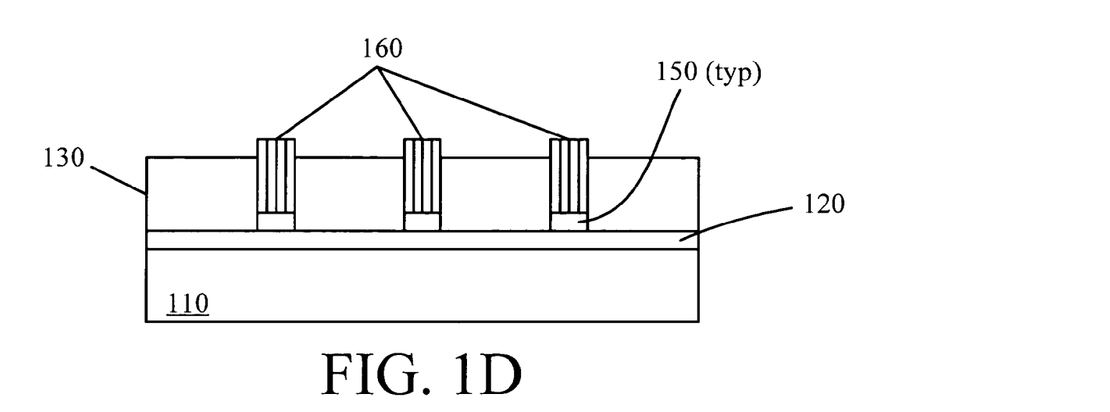

As illustrated in FIG. 1D carbon nanotube bundles 160 may be formed on catalysts 150. In some embodiments, catalysts 150 may be metallized ends or contacts for the fabricated carbon nanotube bundles. In one embodiment, carbon nanotube bundles 160 may be single-wall carbon nanotubes. As shown in FIG. 1D, in some embodiments, carbon nanotube bundles 160 may extend above template film 130. In other embodiments carbon nanotube bundles 160 may have controlled shapes and sizes based on openings 140. In one embodiment, the carbon nanotube bundles 160 may be approximately circular in cross-section. In an embodiment, carbon nanotube bundles 160 may have diameters that are approximately the same as the diameters of openings 140. In various embodiments, the diameters of carbon nanotube bundles 160 may be in the range of about 2 to 200 nm, 2 to 100 nm, or 10 to 40 nm.

Carbon nanotube bundles 160 may be formed on catalysts 150 by any available technique. In some embodiments, carbon nanotube bundles 160 may be formed by chemical vapor deposition with a Carbon containing gas. In some embodiments, carbon nanotube bundles 160 may be formed by chemical vapor deposition with a gas including Ethane or Methane. In an embodiment, carbon nanotube bundles 160 may be formed by chemical vapor deposition through the catalytic thermal decomposition of Carbon Monoxide. In some embodiments the catalytic thermal decomposition of Carbon Monoxide may be performed at a temperature in the range of about 500 to 1300° C. In other embodiments, the catalytic thermal decomposition of Carbon Monoxide may be performed at a temperature in the range of about 700 to 1100° C. In other embodiments, the catalytic thermal decomposition of Carbon Monoxide may be performed at a temperature in the range of about 900 to 1100° C. Other temperature ranges may be available.

Figure 1E:
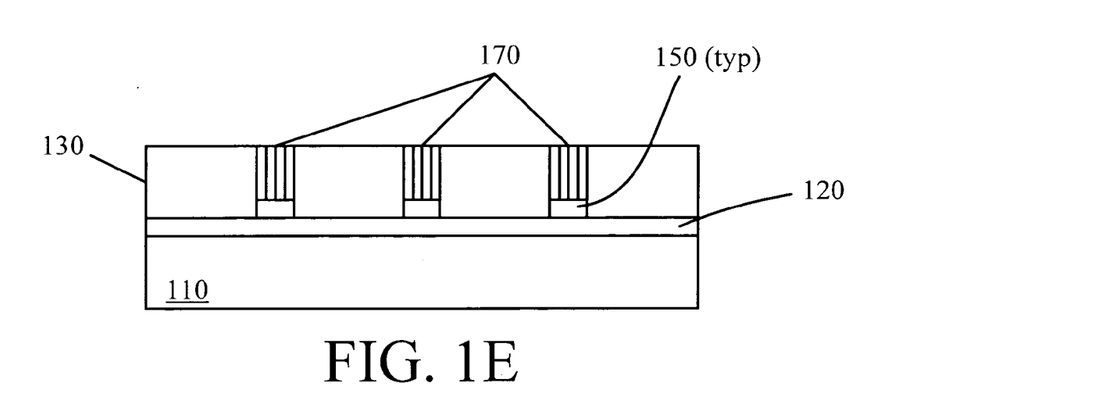

As shown in FIG. 1E, material may be removed from carbon nanotube bundles 160 of FIG. 1C to form controlled length carbon nanotube bundles 170. Controlled length carbon nanotube bundles 170 may have lengths that are approximately equal to the thickness of template film 130. In various embodiments, the lengths of controlled length carbon nanotube bundles 170 may be in the range of about 0.05 to 20 microns, 0.1 to 10 microns, or 1 to 2 microns. Material may be removed from carbon nanotube bundles 160 by any suitable technique. In an embodiment, material may be removed from carbon nanotube bundles 160 by a planarization process such as chemical mechanical polishing. In another embodiment, material may be removed from carbon nanotube bundles 160 by reactive ion etching.

Figure 1F:
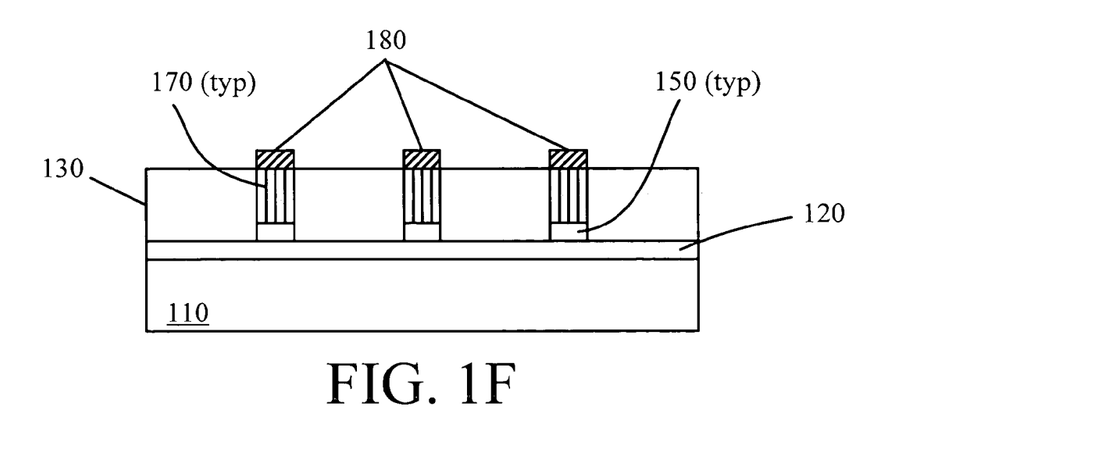

As illustrated in FIG. 1F, metallizations 180 may be formed on the ends of controlled length carbon nanotube bundles 170 by any available method. In some embodiments, metallizations 180 may be formed by selective electrochemical metal deposition. Metallizations 180 may include any metal or alloy. In various embodiments, metallizations 180 may include Palladium, Gold, Silver, Platinum, Ruthenium, Rhodium, Copper, Nickel, Cobalt, Iron, or their alloys.

Figure 1G:
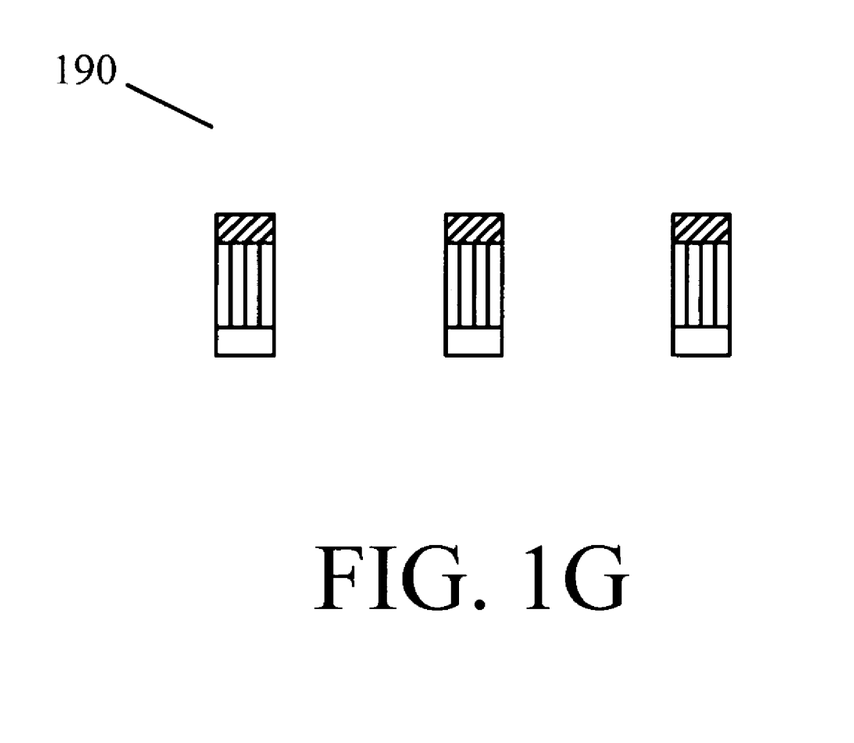

FIG. 1G illustrates that the metallized carbon nanotube bundles 190 may be separated from template film 130, substrate 110, and conductive layer 120. In some embodiments, metallized carbon nanotube bundles 190 may be separated by dissolution into a solution. In an embodiment, metallized carbon nanotube bundles 190 and template film 130 may also be dissolved into solution. In some embodiments, the solution may be an aqueous solution. In other embodiments, the solution may be an aqueous solution including Hydrofluoric Acid.

FIGS. 2A-2D illustrate cross-sectional type views of a method for forming electrical connections using metallized carbon nanotube bundles.

Figure 2A:
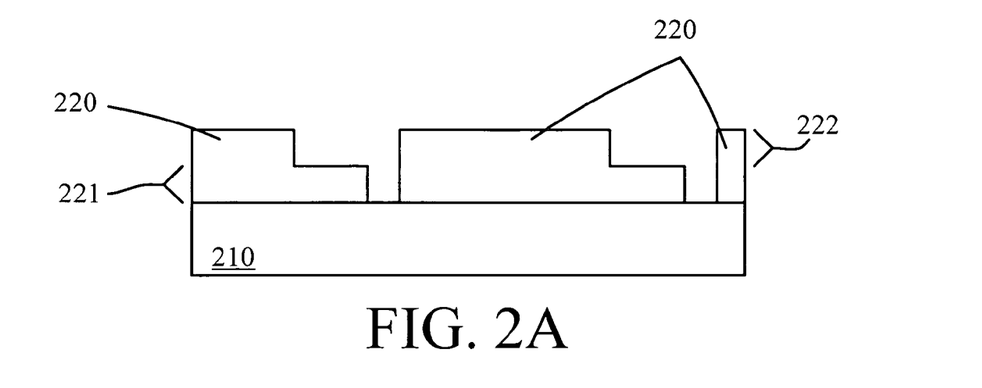
FIGS. 2A-2D illustrate cross sectional type views of a method in accordance with one embodiment of the present invention.

FIG. 2A illustrates a patterned layer 220 on a substrate 210. As illustrated in FIG. 2A, patterned layer 220 may include a via patterning 221 and a metal layer patterning 222. Metal patterning 222 may be above via patterning 221. Substrate 210 may be a wafer or a die and may include monocrystalline silicon, silicon on insulator, or other suitable materials. Substrate 210 may also include other layers or structures (not shown) such as transistors and resistors that comprise insulative, conductive or semiconductive materials.

In some embodiments, patterned layer 220 may be a dielectric material. In other embodiments, patterned layer 220 may include Oxide layers, Nitride layers, or other suitable materials. In some embodiments, patterned layer 220 may be patterned by a dual damascene process as is known in the art.

Figure 2B:
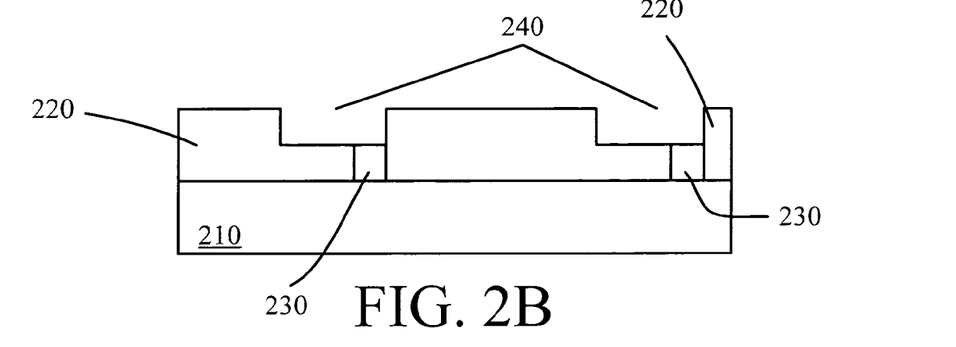

As shown in FIG. 2B, via plugs 230 may be formed in via patterning 221 by methods known in the art, leaving trenches 240 in patterned layer 220. In some embodiments, via plugs 230 may include metals. In an embodiment, via plugs 230 may include copper.

Figure 2C:
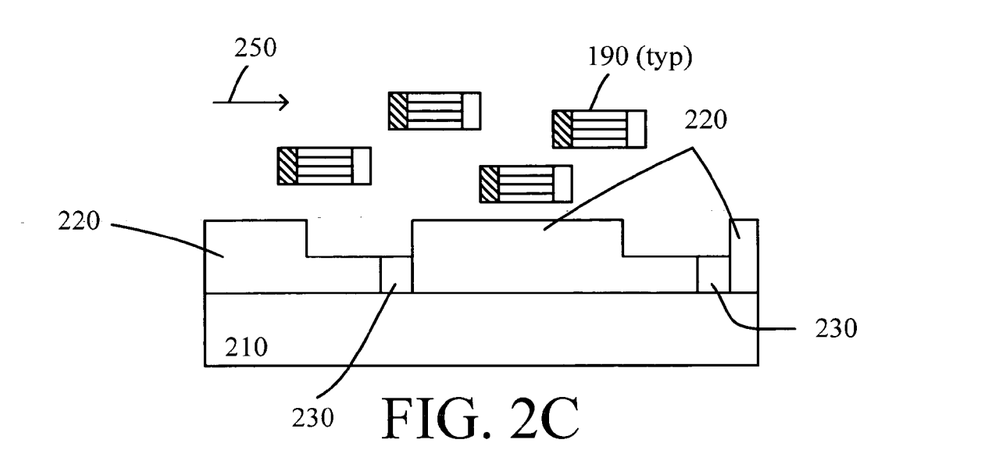

As illustrated in FIG. 2C, metallized carbon nanotube bundles 190 may be flowed over patterned layer 220 and trenches 240 in flow direction 250 in order to deposit metallized carbon nanotube bundles 190 into trenches 240. In one embodiment, metallized carbon nanotube bundles 190 may be in a solution. In another embodiment, flow direction 250 may be substantially parallel to trenches 240. In some embodiments, the lengths of metallized carbon nanotube bundles 190 may be approximately the same as the lengths of trenches 240. In an embodiment, an electric potential may be applied to via plugs 230 to attract the metallized ends of metallized carbon nanotube bundles 190. In other embodiments, the materials of via plugs 230 and the metallized ends of metallized carbon nanotube bundles 190 may be chosen such that metallized carbon nanotube bundles 190 are magnetically attracted to via plugs 230.

Figure 2D:
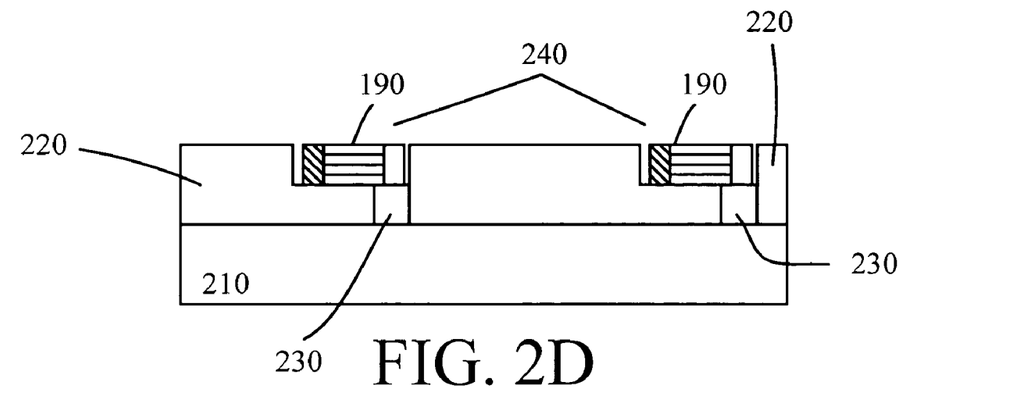

As shown in FIG. 2D, metallized carbon nanotube bundles 190 may be deposited into trenches 240. Connections may be formed between metallized carbon nanotube bundles 190 and via plugs 230. In some embodiments, connections may be formed by plating a metal on via plugs 230. In some embodiments, connections may be made by plating Palladium, Gold, Silver, Platinum, Ruthenium, Rhodium, Copper, Nickel, Cobalt, Iron, or their alloys on via plugs 230. In other embodiments, a metal may be blanket plated into trenches 240, and over metallized carbon nanotube bundles 190 and patterned layer 220 followed by a planarization step, such as chemical mechanical polishing. In an embodiment, the plating may be electroless plating. In some embodiments the blanket plated metal may be Palladium, Gold, Silver, Platinum, Ruthenium, Rhodium, Copper, Nickel, Cobalt, Iron, or their alloys.

In some embodiments, the connection may be annealed to form ohmic contact with low contact resistance. In some embodiments, the connections may be annealed at a temperature in the range of about 100 to 600° C. In other embodiments, connections may be annealed at a temperature in the range of about 100 to 400° C. In other embodiments, connections may be annealed at a temperature in the range of about 200 to 300° C. In some embodiments, the connections may be annealed for a duration in the range of about 0.1 to 120 minutes. In other embodiments, the connections may be annealed for a duration in the range of about 10 to 60 minutes. In other embodiments, the connections may be annealed for a duration in the range of about 30 to 90 minutes. Other temperature and duration ranges may be available.

In some embodiments, metallized carbon nanotube bundles 190 may provide electrical connections within a semiconductor device. In an embodiment the semiconductor device may be a microprocessor. In other embodiments, the semiconductor device may be a memory controller hub, input/output (I/O) controller hub, graphics processor, display processor, network processor, or network interface component. In yet other embodiments, the semiconductor device may be a volatile memory component such as a dynamic random access memory or a static random access memory.

Figure 3:
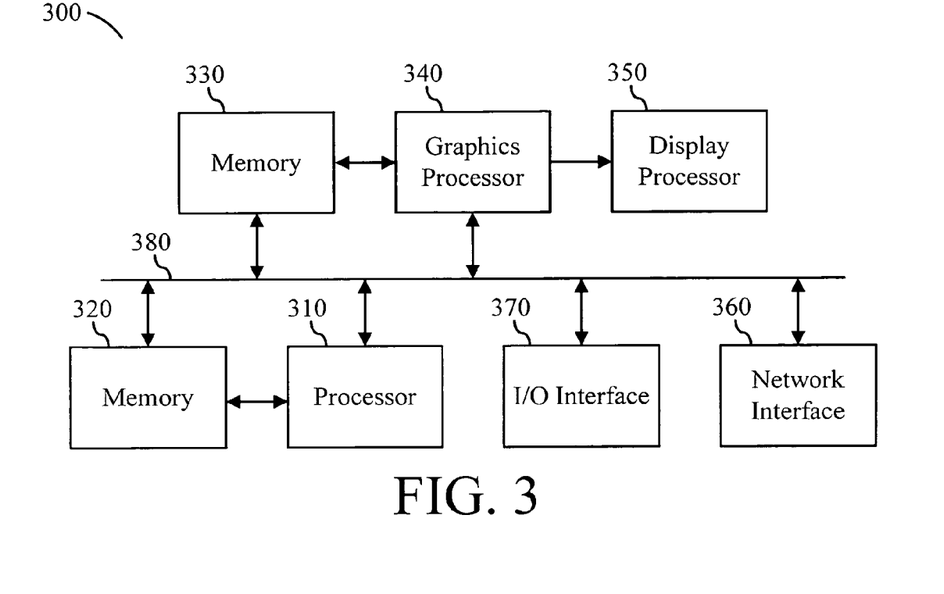
FIG. 3 illustrates a schematic of a system in accordance with one embodiment of the present invention.

As illustrated in FIG. 3, metallized carbon nanotube bundles 190 may be incorporated into a system 300. System 300 may include a processor 310, a memory 320, a memory 330, a graphics processor 340, a display processor 350, a network interface 360, an I/O interface 370, and a communication bus 380. As discussed, any of the components in system 300 may include metallized carbon nanotube bundles 190. In an embodiment, processor 310 may include metallized carbon nanotube bundles 190. In another embodiment, graphics processor 340 may include metallized carbon nanotube bundles 190. A large number of combination of components including metallized carbon nanotube bundles 190 may be available.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method comprising:
   forming an opening in a layer on a conductive layer of a substrate;
   forming a catalyst in the opening;
   fabricating a carbon nanotube bundle on the catalyst;
   removing material from the carbon nanotube bundle; and
   forming a metallization on the carbon nanotube bundle to form a metallized carbon nanotube bundle including the metallization and the catalyst.

2. The method of claim 1, wherein the carbon nanotube bundle comprises a single-wall carbon nanotube bundle.

3. The method of claim 1, wherein the layer comprises one of Aluminum Oxide, Silicon Dioxide, or a Carbon doped oxide.

4. The method of claim 1, wherein the opening is formed by one of a porous anodic treatment or a lithography and etch process.

5. The method of claim 1, wherein the opening has a diameter in the range of about 2 to 100 nm and the layer has a thickness in the range of about 0.1 to 10 microns.

6. The method of claim 1, wherein the conductive layer comprises one of Aluminum, Vanadium, Copper, Palladium, Gold, or Silver.

7. The method of claim 1, wherein forming the catalyst comprises forming the catalyst by one of electrochemical deposition, atomic layer deposition, or chemical vapor deposition and the catalyst comprises one of Iron, Cobalt, Nickel, Platinum, or Molybdenum.

8. The method of claim 1, wherein fabricating the carbon nanotube bundle comprises fabricating the carbon nanotube bundle by chemical vapor deposition.

9. The method of claim 1, wherein fabricating the carbon nanotube bundle comprises fabricating the carbon nanotube bundle by catalytic thermal decomposition at temperature in the range of about 700 to 1100° C.

10. The method of claim 1, wherein removing material comprises removing material by one of reactive ion etching or chemical mechanical polishing.

11. The method of claim 1, wherein forming the metallization comprises forming the metallization by one of selective electrochemical deposition, chemical vapor deposition, or atomic layer deposition and the metallization comprises one of Palladium, Gold, Silver, Platinum, Ruthenium, Rhodium, Copper, Nickel, Cobalt, or Iron.

12. The method of claim 1, further comprising:
   dissolving the layer and the metallized carbon nanotube bundle into a solution.

13. The method of claim 12, further comprising:
   flowing the solution on a second substrate including a trench to place the metallized carbon nanotube bundle into the trench.

14. The method of claim 13, further comprising:
   forming a connection between the metallized single-wall carbon nanotube bundle and a via plug in the trench.

15. The method of claim 14, wherein forming the connection comprises forming the connection by plating with one of Palladium, Gold, Silver, Platinum, Ruthenium, Rhodium, Copper, Nickel, Cobalt, or Iron and annealing at a temperature in the range of about 100 to 400° C.

16. A method comprising:
   flowing a solution including a metallized carbon nanotube bundle on a substrate including a trench to place the metallized carbon nanotube bundle into the trench; and
   forming a connection between the metallized carbon nanotube bundle and a via plug in the trench.

17. The method of claim 16, wherein flowing the solution comprises flowing the solution parallel to the trench.

18. The method of claim 16, further comprising:
   providing an electrical potential to the via plug to attract the metallized carbon nanotube bundle to the via plug.

19. The method of claim 16, wherein forming the connection comprises forming the connection by plating with one of Palladium, Gold, Silver, Platinum, Ruthenium, Rhodium, Copper, Nickel, Cobalt, or Iron.

20. The method of claim 16, wherein forming the connection comprises forming the connection by electroless plating and chemical mechanical polishing.

21. A method comprising:
   forming a layer including an opening on a conductive layer of a substrate;
   forming a catalyst in the opening;

fabricating a single-wall carbon nanotube bundle on the catalyst;

removing material from the single-wall carbon nanotube bundle;

forming a metallization on the single-wall carbon nanotube bundle to form a metallized single-wall carbon nanotube bundle including the metallization and the catalyst;

dissolving the layer and the metallized single-wall carbon nanotube bundle into a solution;

flowing the solution parallel to a trench in a second substrate to place the metallized single-wall carbon nanotube bundle into the trench; and forming a connection between the metallized single-wall carbon nanotube bundle and a via plug in the trench.

22. The method of claim 21, wherein the catalyst comprises one of Iron, Cobalt, Nickel, Platinum, or Molybdenum and the metallization comprises on of of Palladium, Gold, Silver, Platinum, Ruthenium, Rhodium, Copper, Nickel, Cobalt, or Iron.

23. The method of claim 21, wherein forming the connection comprises forming the connection by plating with one of Palladium, Gold, Silver, Platinum, Ruthenium, Rhodium, Copper, Nickel, Cobalt, or Iron.

* * * * *